US012601083B2

(12) United States Patent
Qi et al.

(10) Patent No.: US 12,601,083 B2
(45) Date of Patent: Apr. 14, 2026

(54) PROCESS FOR SYNTHESIZING SPINEL-COATED SINGLE-CRYSTAL CATHODE ACTIVE MATERIALS

(71) Applicant: GM GLOBAL TECHNOLOGY OPERATIONS LLC, Detroit, MI (US)

(72) Inventors: Gongshin Qi, Troy, MI (US); Devendrasinh Darbar, Sterling Heights, MI (US); Raneen Taha, Sterling Heights, MI (US); Xinwei Jiao, Hilliard, OH (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 272 days.

(21) Appl. No.: 18/539,825

(22) Filed: Dec. 14, 2023

(65) Prior Publication Data

US 2025/0198045 A1     Jun. 19, 2025

(51) Int. Cl.
| | |
|---|---|
| *C30B 1/12* | (2006.01) |
| *C30B 29/22* | (2006.01) |
| *H01M 4/505* | (2010.01) |
| *H01M 4/02* | (2006.01) |

(52) U.S. Cl.
CPC ................ *C30B 1/12* (2013.01); *C30B 29/22* (2013.01); *H01M 4/505* (2013.01); *H01M 2004/028* (2013.01)

(58) Field of Classification Search
CPC .......... C30B 1/12; C30B 29/22; H01M 4/505; H01M 2004/028
See application file for complete search history.

(56) References Cited

U.S. PATENT DOCUMENTS

| | | | |
|---|---|---|---|
| 6,190,800 B1 * | 2/2001 | Iltchev | C01G 45/02 |
| | | | 429/231.95 |
| 2016/0028076 A1 * | 1/2016 | Lee | C01G 31/006 |
| | | | 427/126.3 |
| 2019/0100850 A1 * | 4/2019 | Ates | C25D 3/665 |
| 2023/0246183 A1 * | 8/2023 | Saito | H01M 4/364 |
| | | | 429/231.3 |

FOREIGN PATENT DOCUMENTS

| | | | | |
|---|---|---|---|---|
| DE | 112022001653 T5 | 1/2024 | | |
| WO | WO-9420650 A2 * | 9/1994 | | C25C 3/08 |
| WO | WO-2021245562 A1 | 12/2021 | | |

OTHER PUBLICATIONS

Office Action dated Jun. 17, 2024 from German Patent Office for German Patent No. 10 2024 102 651.0; 5pgs.

* cited by examiner

*Primary Examiner* — Robert M Kunemund

(57) ABSTRACT

A method for manufacturing cathode active material includes providing a polycrystalline transition metal precursor; providing a lithium salt composition including a first lithium salt and a second lithium salt having a eutectic melting temperature; creating a first mixture including the polycrystalline transition metal precursor and the lithium salt composition; mixing the first mixture in a mixer to generate inter-frictional force to heat the lithium salt composition above the eutectic melting temperature and to generate a second mixture; and sintering the second mixture to form a spinel-coated single-crystal cathode active material.

18 Claims, 5 Drawing Sheets

PROCESS FOR SYNTHESIZING SPINEL-COATED SINGLE-CRYSTAL CATHODE ACTIVE MATERIALS

INTRODUCTION

The information provided in this section is for the purpose of generally presenting the context of the disclosure. Work of the presently named inventors, to the extent it is described in this section, as well as aspects of the description that may not otherwise qualify as prior art at the time of filing, are neither expressly nor impliedly admitted as prior art against the present disclosure.

The present disclosure relates to battery cells, and more particularly to a process for synthesizing spinel-coated single-crystal cathode active materials for cathode electrodes.

Electric vehicles (EVs) such as battery electric vehicles (BEVs), hybrid vehicles, and/or fuel cell vehicles include one or more electric machines and a battery system including one or more battery cells, modules, and/or packs. A power control system is used to control charging and/or discharging of the battery system during charging and/or driving.

Battery cells include cathode electrodes, anode electrodes, and separators. The cathode electrodes include a cathode active material layer arranged on a cathode current collector. The anode electrodes include an anode active material layer arranged on an anode current collector.

SUMMARY

A method for manufacturing cathode active material includes providing a polycrystalline transition metal precursor; providing a lithium salt composition including a first lithium salt and a second lithium salt having a eutectic melting temperature; creating a first mixture including the polycrystalline transition metal precursor and the lithium salt composition; mixing the first mixture in a mixer to generate inter-frictional force to heat the lithium salt composition above the eutectic melting temperature and to generate a second mixture; and sintering the second mixture to form a spinel-coated single-crystal cathode active material.

In other features, the polycrystalline transition metal precursor and the lithium salt composition are mixed in a mixer selected from a group consisting of a planetary centrifugal mixer, a ball milling machine, a theta composer, and an acoustic mixer for a predetermined period in a range from 5 to 120 minutes. Providing the polycrystalline transition metal precursor includes creating a third mixture including one or more transition metal precursors and one or more precursors for one of a hydroxide, a carbonate, an oxalate, and an oxide; and heating and stirring the third mixture for a predetermined period.

In other features, the third mixture is heated to a predetermined temperature in a range from 25° C. to 80° C. The third mixture is stirred at a predetermined speed in a range from 700 to 2000 rpm. The predetermined period is in a range from 0.5 h to 48 h. The pH of the polycrystalline transition metal precursor is in a range from 7.5 to 11.5. The polycrystalline transition metal precursor includes one or more transition metals selected from a group consisting of nickel (Ni), manganese (Mn), iron (Fe), molybdenum (Mo), niobium (Nb), magnesium (Mg), aluminum (Al), titanium (Ti), zirconium (Zr), copper (Cu), and cobalt (Co).

In other features, the eutectic melting temperature is less than or equal to 200° C. A molar ratio of the lithium salt composition to the polycrystalline transition metal precursor is in a range from 1.1 to 1.6.

In other features, the one or more transition metal precursors comprise aqueous manganese sulfate and aqueous nickel sulfate. The one or more precursors comprise sodium hydroxide and ammonia hydroxide. The first lithium salt comprises lithium hydroxide. The second lithium salt comprises lithium nitrate.

In other features, the spinel-coated single-crystal cathode active material comprises lithium- and manganese-rich (LMR), lithium manganese oxide (LMO), lithium nickel manganese oxide (LNMO), lithium nickel manganese cobalt (NMC), lithium nickel manganese cobalt aluminum (NMCA), lithium nickel cobalt aluminum (NCA), lithium iron phosphate (LFP), and lithium manganese iron phosphate (LMFP).

A method for manufacturing cathode active material includes creating a polycrystalline transition metal precursor by creating a first mixture including one or more transition metal precursors for one or more transition metals selected from a group consisting of nickel (Ni), manganese (Mn), iron (Fe), molybdenum (Mo), niobium (Nb), magnesium (Mg), aluminum (Al), titanium (Ti), zirconium (Zr), copper (Cu), and cobalt (Co) and one or more precursors for one of a hydroxide, a carbonate, an oxalate, and an oxide; and heating and stirring the first mixture for a predetermined period. The method includes providing a lithium salt composition including a first lithium salt and a second lithium salt having a eutectic melting temperature less than 200° C.; combining the polycrystalline transition metal precursor and the lithium salt composition to create a second mixture; mixing the second mixture using a mixer to generate inter-frictional force and heat the lithium salt composition above the eutectic melting temperature to form a third mixture; and sintering the third mixture to form a spinel-coated single-crystal cathode active material selected from a group consisting of lithium- and manganese-rich LMR, lithium manganese oxide (LMO), lithium nickel manganese oxide (LNMO), lithium nickel manganese cobalt (NMC), lithium nickel manganese cobalt aluminum (NMCA), lithium nickel cobalt aluminum (NCA), lithium iron phosphate (LFP), and lithium manganese iron phosphate (LMFP).

In other features, the polycrystalline transition metal precursor and the lithium salt composition are mixed in a mixer selected from a group consisting of a planetary centrifugal mixer, a ball milling machine, a theta composer, and an acoustic mixer for a predetermined period in a range from 5 to 120 minutes. The first mixture is heated to a predetermined temperature in a range from 25° C. to 80° C. The first mixture is stirred at a predetermined speed in a range from 700 to 2000 rpm. The predetermined period is in a range from 0.5 h to 48 h.

In other features, the pH of the polycrystalline transition metal precursor is in a range from 7.5 to 11.5. A molar ratio of the lithium salt composition to the polycrystalline transition metal precursor is in a range from 1.1 to 1.6. The one or more transition metal precursors comprise aqueous manganese sulfate and aqueous nickel sulfate. The one or more precursors comprise sodium hydroxide and ammonia hydroxide. The first lithium salt comprises lithium hydroxide and the second lithium salt comprises lithium nitrate.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

While battery cells according to the present disclosure are shown in the context of electric vehicles, the battery cells can be used in stationary applications and/or other applications.

Existing methods for synthesizing single-crystal cathode active material (e.g., lithium- and manganese-rich (LMR) cathode active material) include high temperature sintering or molten salt synthesis. High temperature sintering typically requires temperatures greater than 1000° C. and excess lithium content to offset lithium evaporation. The high temperature sintering method may also require a post-calcination washing step. Molten salt synthesis requires a significant amount of molten salt. The cathode active material may also need to be washed after high temperature calcination.

The present disclosure relates to a process for preparing cathode active materials (e.g., spinel-coated single-crystal LMR cathode active material) stabilized by the spinel phase formed during the preparation process. In some examples, the spinel phase is formed by controlling a ratio of transition metals such as Ni/Mn or a ratio of Li and total transition metals. In some examples, the transition metals are selected from a group consisting of nickel (Ni), manganese (Mn), iron (Fe), molybdenum (Mo), niobium (Nb), magnesium (Mg), aluminum (Al), titanium (Ti), zirconium (Zr), copper (Cu), and cobalt (Co). In some examples, the process can be performed at temperatures less than 900° C. No molten salts and significantly less excess lithium salts are needed, which reduces manufacturing cost.

The preparation process is based on interfacial reactive wetting, mediated by transient eutectic salts in situ melted by moderate mechanical mixing, to form a colloidal suspension of the LMR precursors dispersed in liquefied lithium salts. The preparation process effectively deagglomerates polycrystalline precursors and homogenizes the lithium-salt distribution. This enables facile particle coarsening later into the single-crystalline morphology with improved electrochemical performance.

Figure 1:
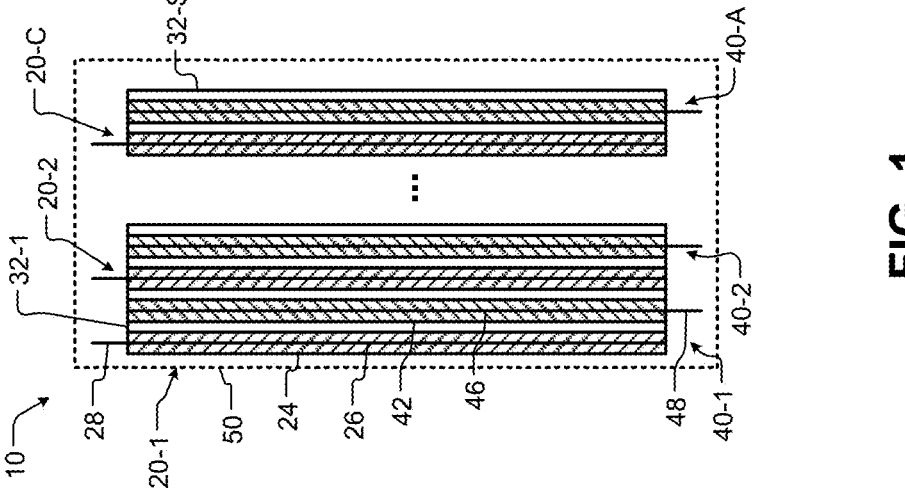
FIG. 1 is a side cross section of an example of a battery cell including anode electrodes, cathode electrodes, and separators according to the present disclosure.

Referring now to FIG. 1, a battery cell 10 includes C cathode electrodes 20, A anode electrodes 40, and S separators 32 arranged in a predetermined sequence in a battery cell stack 12, where C, S and A are integers greater than zero. The battery cell stack 12 is arranged in an enclosure 50. The C cathode electrodes 20-1, 20-2, . . . , and 20-C include cathode active material layers 24 arranged on one or both sides of a cathode current collector 26.

The A anode electrodes 40-1, 40-2, . . . , and 40-A include anode active material layers 42 arranged on one or both sides of the anode current collectors 46. The S separators 32-1, 32-2, . . . , and 32-S are arranged between adjacent pairs of the C cathode electrodes 20 and the A anode electrodes 40. In some examples, the cathode active material layers 24 and/or the anode active material layers 42 comprise coatings including one or more active materials, one or more conductive additives, and/or one or more binder materials that are cast or applied to the current collectors. During charging/discharging, the A anode electrodes 40 and the C cathode electrodes 20 exchange lithium ions.

In some examples, the cathode current collector 26 and/or the anode current collector 46 comprise metal foil, metal mesh, perforated metal, 3 dimensional (3D) metal foam, and/or expanded metal. In some examples, the current collectors are made of one or more materials selected from a group consisting of copper, stainless steel, brass, bronze, zinc, aluminum, and/or alloys thereof. External tabs 28 and 48 are connected to the current collectors of the cathode electrodes and anode electrodes, respectively, and can be arranged on the same or different sides of the battery cell stack 12. The external tabs 28 and 48 are connected to terminals of the battery cells.

Figure 2:
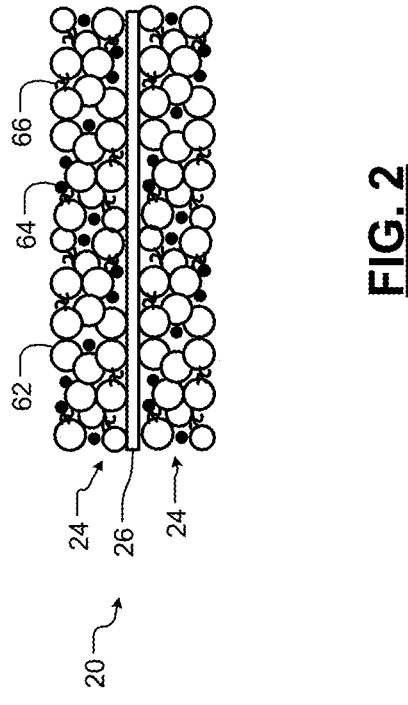
FIG. 2 is a side cross section of an example of a cathode electrode according to the present disclosure.

Referring now to FIG. 2, the C cathode electrodes 20 are shown in further detail. The cathode active material layer 24 of the C cathode electrodes 20 includes cathode active material 62, an optional conductive additive 64, and an optional binder 66. In some examples, the cathode active material comprises lithium- and manganese-rich (LMR), lithium manganese oxide (LMO), lithium nickel manganese oxide (LNMO), lithium nickel manganese cobalt (NMC), lithium nickel manganese cobalt aluminum (NMCA), lithium nickel cobalt aluminum (NCA), lithium iron phosphate (LFP), and lithium manganese iron phosphate (LMFP).

Figures 3A, 3B:
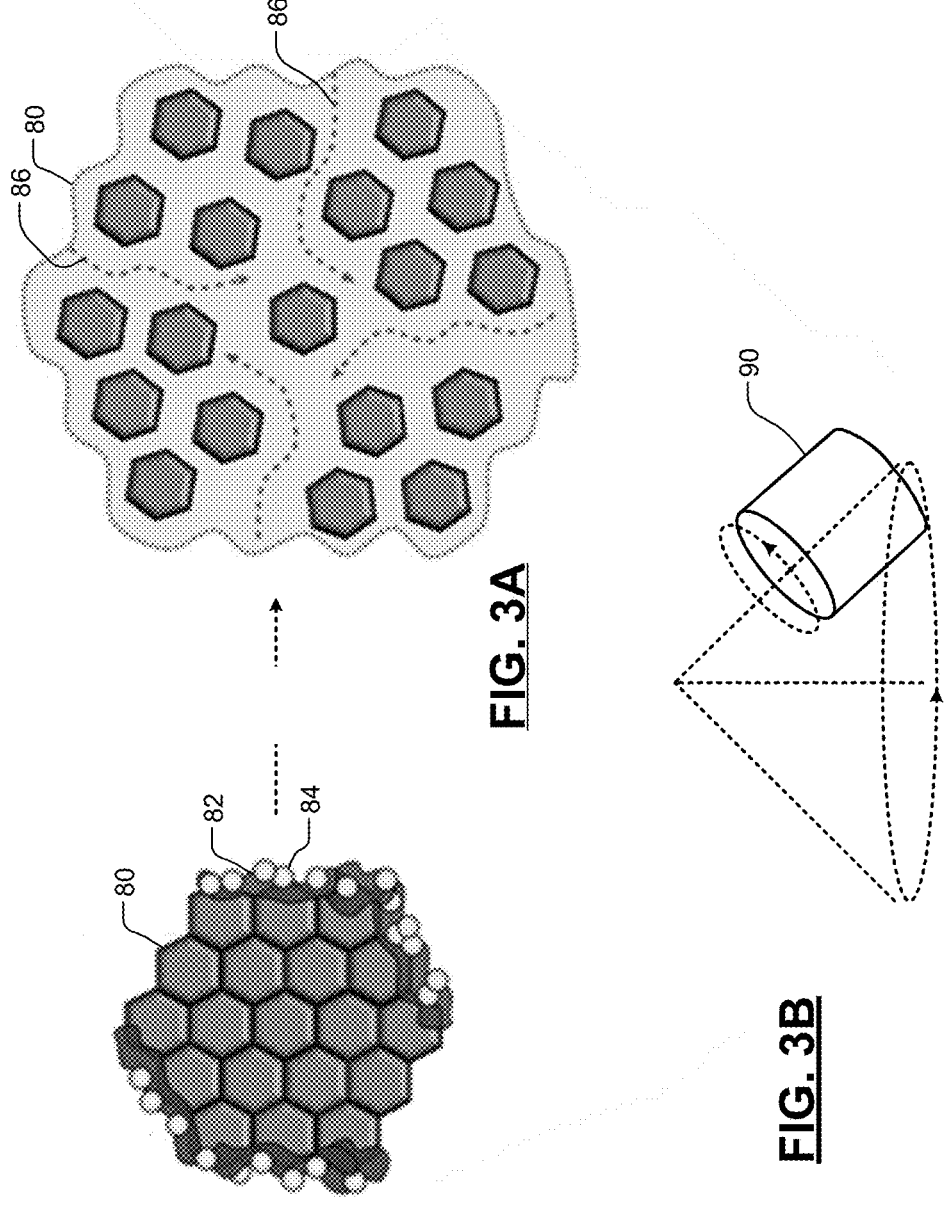
FIG. 3A illustrates an example of a polycrystalline transition metal precursor mixed with a lithium salt composition and disruption of grain boundaries due to melting of the lithium salt composition due to inter-particle frictional forces generated during mixing according to the present disclosure.
FIG. 3B illustrates an example of a planetary mixer for mixing the polycrystalline transition metal precursor(s) and lithium salt composition according to the present disclosure.

Referring now to FIGS. 3A and 3B, prior to mixing in a planetary or other type of mixer, the polycrystalline transition metal precursor(s) 80 are coated with lithium salts 82 and 84. In FIG. 3A, inter-particle frictional forces are generated to melt the lithium salts during mixing. The melted lithium salts wet, corrode, and separate grain boundaries 86 of the polycrystalline transition metal precursor(s) 80. In FIG. 3B, planetary mixing or other types of mixing of the polycrystalline transition metal precursor(s) and the lithium salts may be used. When planetary mixing is used, a mixing container is rotated using a planetary motion.

Figure 4:
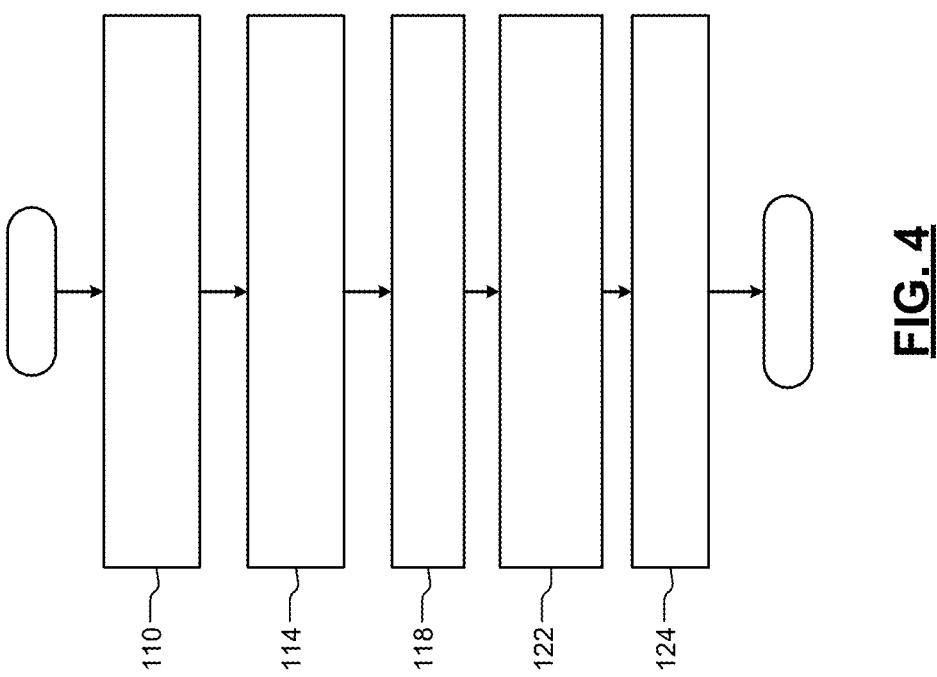

Referring now to FIG. 4, a process for preparing cathode active material is shown. At 110, a mixture including one or more precursor(s) for one or more transition metal(s) and/or hydroxide, carbonate, oxalate, and/or oxide precursors is created. In some examples, the transition metals are selected from a group consisting of nickel (Ni), manganese (Mn), iron (Fe), molybdenum (Mo), niobium (Nb), magnesium (Mg), aluminum (Al), titanium (Ti), zirconium (Zr), copper (Cu), and cobalt (Co). For example, the mixture may include aqueous manganese sulfate ($MnSO_4$), aqueous nickel sulfate ($NiSO_4$), sodium hydroxide (NaOH), and ammonia hydroxide ($NH_4OH$) for LMR.

At 114, the mixture is heated and stirred at predetermined temperature and mixing speed for a predetermined reaction period to precipitate or coprecipitate the transition metals and form polycrystalline transition metal precursor (e.g., such as $Mn_{0.7}Ni_{0.3}(OH)_2$). In some examples, the predetermined temperature is in a range from 25° C. to 80° C. In some examples, the pH of the mixture is controlled within a range from 7.5 to 11.5 to control morphology.

In some examples, the mixture is stirred at a speed in a range from 700 to 2000 rpm. In some examples, the predetermined reaction period is in a range from 0.5 h to 48 h. Precipitation or co-precipitation occurs to form the polycrystalline transition metal precursor.

At 118, a lithium salt composition including two or more lithium salts is added to the polycrystalline transition metal precursor. The composition of the two or more lithium salts is near the corresponding eutectic point. In some examples, the eutectic melting temperature is less than 200° C. In some examples, the lithium salts are selected from a group consisting of lithium carbonate ($Li_2CO_3$), lithium nitrate ($LiNO_3$), lithium hydroxide (LiOH), lithium chloride (LiCl), lithium fluoride (LiF) and/or combinations thereof (e.g., with a eutectic melting temperature less than 200° C.).

In some examples, the molar ratio of the lithium salts to the transition metals is in a range from 1.1 to 1.6. In some examples, a ratio of Mn to Ni is in a range from 1.0 to 4.0 for LMR.

At 122, the mixture is mixed for a predetermined period. In some examples, the mixer includes a planetary centrifugal mixer, a ball milling machine, a theta composer, or an acoustic mixer. In some examples, the predetermined period is in a range from 5 min to 120 min. The mixing increases inter-particle frictional forces to increase the temperature of the mixture above the eutectic melting temperature. The lithium salt composition melts to wet, corrode, and separate grain boundaries of the polycrystalline transition metal precursors.

At 124, the mixture is sintered after mixing to form a spinel-coated single-crystal cathode active material. In some examples, the mixture is heated to a temperature in a range from 500° C. to 1200° C. in air or oxygen for a predetermined period in a range from 1 h to 48 h. In some examples, the single crystal particle size of the spinel-coated single-crystal cathode active material is in a range from 0.5 μm to 2 μm. In some examples, the spinel phase is in a range from 1 wt. % to 10 wt. %. The spinel phase stabilizes the cathode active material.

Figure 5:
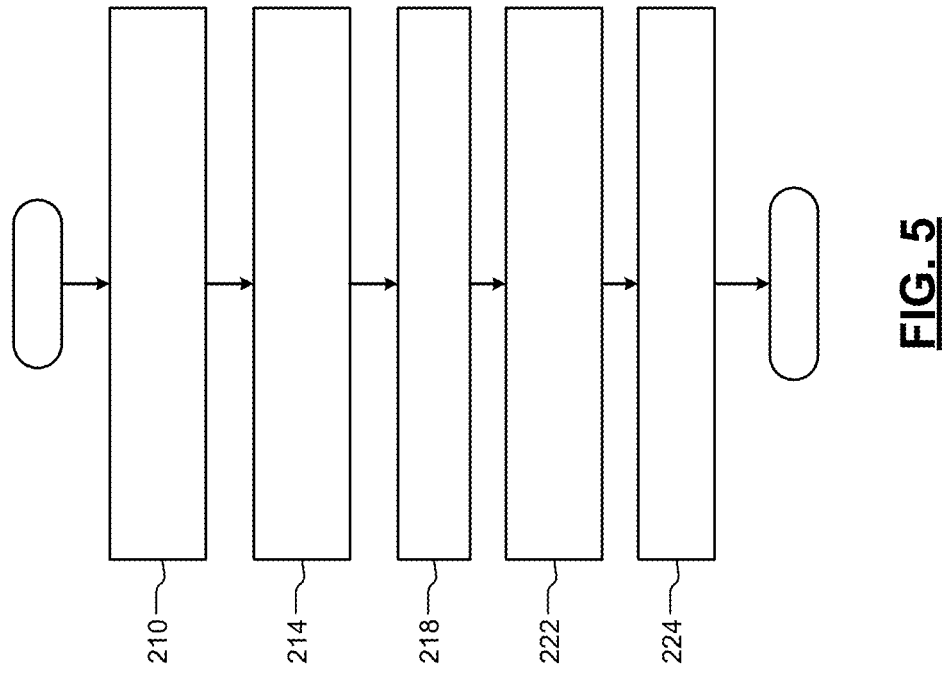
FIGS. 4 and 5 flowcharts of examples of processes for synthesizing spinel-coated single-crystal cathode active material according to the present disclosure.

Referring now to FIG. 5, a process for preparing spinel-coated single-crystal LMR cathode active material is shown. At 210, a mixture is created and includes Mn, Ni, and hydroxide precursors. For example, the mixture may include aqueous manganese sulfate ($MnSO_4$), aqueous nickel sulfate ($NiSO_4$), sodium hydroxide (NaOH), and ammonia hydroxide ($NH_4OH$) for LMR. At 214, the mixture is heated and stirred at predetermined temperature and mixing speed for a predetermined reaction period to precipitate or coprecipitate the transition metals and form $Mn_{0.7}Ni_{0.3}(OH)_2$.

At 218, a lithium salt composition including LiOH and $LiNO_3$ near the corresponding eutectic point is added to the polycrystalline transition metal precursor. At 222, the mixture is mixed for a predetermined period in a mixer. The lithium salt composition melts to wet, corrode, and separate grain boundaries of the polycrystalline transition metal precursors. At 224, the mixture is sintered after mixing to form the spinel-coated single-crystal LMR cathode active material.

Figure 6:
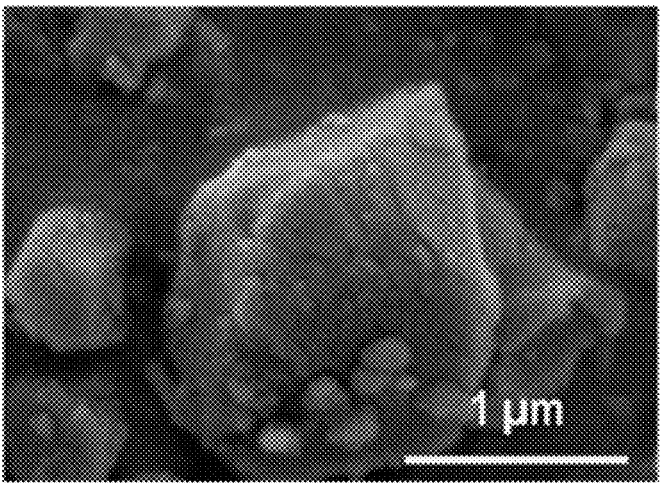
FIG. 6 is a scanning electron microscope image of an example of a spinel-coated single-crystal cathode active material according to the present disclosure.
Figure 7:
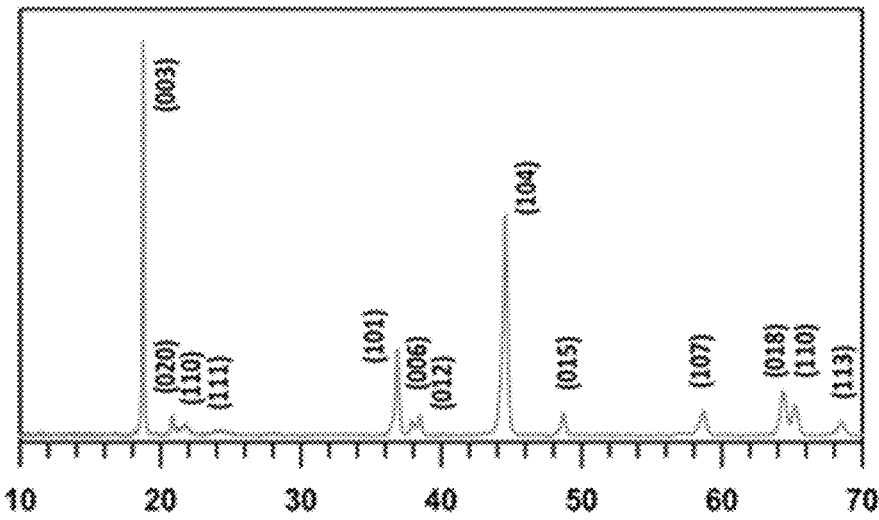
FIG. 7 is a graph illustrating x-ray diffraction (XRD) for an example of the spinel-coated single crystal cathode active material according to the present disclosure.
Figure 9:
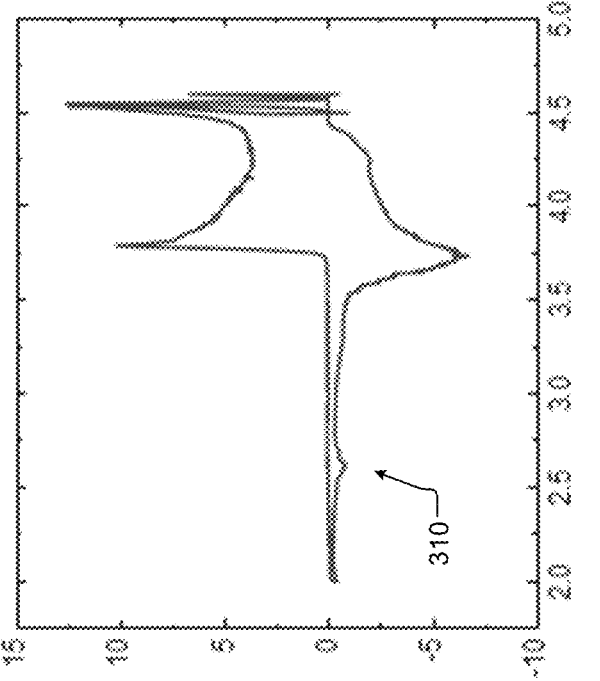
FIG. 9 is a graph of dQ/dV as a function of voltage confirming a spinel phase during the first formation cycle.
Figure 8:
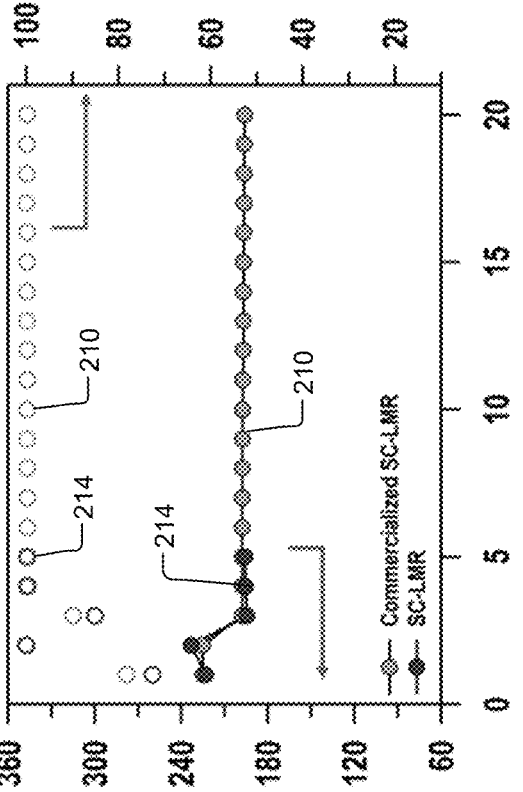
FIG. 8 is a graph illustrating specific capacity and columbic efficiency for cathode electrodes including LMR manufactured according to the present disclosure compared to an example commercially-available LMR.

Referring now to FIGS. 6 to 9, the composition of the spinel-coated single-crystal cathode active material (e.g., LMR) produced using the process described herein was confirmed using several different methods. In FIG. 6, a scanning electron microscope image of the spinel-coated single-crystal cathode active material is shown. In FIG. 7, x-ray diffraction (XRD) for an example of the spinel-coated single crystal cathode active material is shown. The peaks in the XRD correspond to the desired materials in the cathode active material. In FIG. 8, specific capacity and columbic efficiency for cathode electrodes including LMR manufactured according to the present disclosure at 214 is compared to an example of commercial LMR cathode active material at 210. The LMR particles have similar performance. In FIG. 9, a graph of dQ/dV as a function of voltage during the first formation cycle is shown. A local minimum at 2.7V demonstrates that the spinel phase was created. In this example, the first cycle efficiency was 74.72% (vs. 78.11 for commercial LMR), the first cycle discharge capacity at C/20 was 223.04 mAh/g (vs. 224.91 mAh/g), and the first cycle discharge capacity at C/3 was 193.34 mAh/g (vs. 197.57 mAh/g). Therefore, the LMR produced using the process described herein has similar performance at a much lower cost.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

What is claimed is:

1. A method for manufacturing cathode active material, comprising:
    providing a polycrystalline transition metal precursor;
    providing a lithium salt composition including a first lithium salt and a second lithium salt having a eutectic melting temperature;
    creating a first mixture including the polycrystalline transition metal precursor and the lithium salt composition;
    mixing the first mixture in a mixer to generate inter-frictional force to heat the lithium salt composition above the eutectic melting temperature and to generate a second mixture; and
    sintering the second mixture to form a spinel-coated single-crystal cathode active material.

2. The method of claim 1, wherein the polycrystalline transition metal precursor and the lithium salt composition are mixed in a mixer selected from a group consisting of a planetary centrifugal mixer, a ball milling machine, a theta composer, and an acoustic mixer for a predetermined period in a range from 5 to 120 minutes.

3. The method of claim 1, wherein providing the polycrystalline transition metal precursor includes:
    creating a third mixture including one or more transition metal precursors and one or more precursors for one of a hydroxide, a carbonate, an oxalate, and an oxide; and
    heating and stirring the third mixture for a predetermined period.

4. The method of claim 3, wherein the third mixture is heated to a predetermined temperature in a range from 25° C. to 80° C.

5. The method of claim 3, wherein the third mixture is stirred at a predetermined speed in a range from 700 to 2000 rpm.

6. The method of claim 3, wherein the predetermined period is in a range from 0.5 h to 48 h.

7. The method of claim 1, wherein the pH of the polycrystalline transition metal precursor is in a range from 7.5 to 11.5.

8. The method of claim 1, wherein the polycrystalline transition metal precursor includes one or more transition metals selected from a group consisting of nickel (Ni), manganese (Mn), iron (Fe), molybdenum (Mo), niobium (Nb), magnesium (Mg), aluminum (Al), titanium (Ti), zirconium (Zr), copper (Cu), and cobalt (Co).

9. The method of claim 1, wherein the eutectic melting temperature is less than or equal to 200° C.

10. The method of claim 1, wherein a molar ratio of the lithium salt composition to the polycrystalline transition metal precursor is in a range from 1.1 to 1.6.

11. The method of claim 3, wherein:
    the one or more transition metal precursors comprise aqueous manganese sulfate and aqueous nickel sulfate,
    the one or more precursors comprise sodium hydroxide and ammonia hydroxide,
    the first lithium salt comprises lithium hydroxide, and
    the second lithium salt comprises lithium nitrate.

12. The method of claim 1, wherein the spinel-coated single-crystal cathode active material comprises lithium- and manganese-rich (LMR), lithium manganese oxide (LMO), lithium nickel manganese oxide (LNMO), lithium nickel manganese cobalt (NMC), lithium nickel manganese cobalt aluminum (NMCA), lithium nickel cobalt aluminum (NCA), lithium iron phosphate (LFP), and lithium manganese iron phosphate (LMFP).

13. A method for manufacturing cathode active material, comprising:
    creating a polycrystalline transition metal precursor by:
        creating a first mixture including one or more transition metal precursors for one or more transition metals selected from a group consisting of nickel (Ni), manganese (Mn), iron (Fe), molybdenum (Mo), niobium (Nb), magnesium (Mg), aluminum (Al), titanium (Ti), zirconium (Zr), copper (Cu), and cobalt (Co) and one or more precursors for one of a hydroxide, a carbonate, an oxalate, and an oxide; and
        heating and stirring the first mixture for a predetermined period;
    providing a lithium salt composition including a first lithium salt and a second lithium salt having a eutectic melting temperature less than 200° C.;
    combining the polycrystalline transition metal precursor and the lithium salt composition to create a second mixture;
    mixing the second mixture using a mixer to generate inter-frictional force and heat the lithium salt composition above the eutectic melting temperature to form a third mixture; and
    sintering the third mixture to form a spinel-coated single-crystal cathode active material selected from a group consisting of lithium- and manganese-rich LMR, lithium manganese oxide (LMO), lithium nickel manganese oxide (LNMO), lithium nickel manganese cobalt (NMC), lithium nickel manganese cobalt aluminum (NMCA), lithium nickel cobalt aluminum (NCA), lithium iron phosphate (LFP), and lithium manganese iron phosphate (LMFP).

14. The method of claim 13, wherein the polycrystalline transition metal precursor and the lithium salt composition are mixed in a mixer selected from a group consisting of a planetary centrifugal mixer, a ball milling machine, a theta composer, and an acoustic mixer for a predetermined period in a range from 5 to 120 minutes.

15. The method of claim 13, wherein:
    the first mixture is heated to a predetermined temperature in a range from 25° C. to 80° C.,
    the first mixture is stirred at a predetermined speed in a range from 700 to 2000 rpm, and
    the predetermined period is in a range from 0.5 h to 48 h.

16. The method of claim 13, wherein the pH of the polycrystalline transition metal precursor is in a range from 7.5 to 11.5.

17. The method of claim 13, wherein a molar ratio of the lithium salt composition to the polycrystalline transition metal precursor is in a range from 1.1 to 1.6.

18. The method of claim 13, wherein:

the one or more transition metal precursors comprise aqueous manganese sulfate and aqueous nickel sulfate, the one or more precursors comprise sodium hydroxide and ammonia hydroxide, and the first lithium salt comprises lithium hydroxide and the second lithium salt comprises lithium nitrate.

\* \* \* \* \*